(12) United States Patent
Chauhan et al.

(10) Patent No.: US 7,218,147 B2
(45) Date of Patent: May 15, 2007

(54) INPUT BUFFER AND METHOD OF OPERATING THE SAME

(75) Inventors: Rajat Chauhan, Uttaranchal (IN); Rajesh Kaushik, Haryana (IN)

(73) Assignee: STMicroelectronics PVT. Ltd., Uttar Pradesh (IN)

( * ) Notice: Subject to any disclaimer, the term of this patent is extended or adjusted under 35 U.S.C. 154(b) by 187 days.

(21) Appl. No.: 10/957,318

(22) Filed: Oct. 1, 2004

(65) Prior Publication Data
US 2005/0174146 A1 Aug. 11, 2005

(30) Foreign Application Priority Data
Oct. 1, 2003 (IN) .................. 1231/DEL/2003

(51) Int. Cl.
*H03K 19/0175* (2006.01)
(52) U.S. Cl. .......................................... 326/82; 326/86
(58) Field of Classification Search ............. 326/82, 326/83, 86, 63, 68; 327/108, 109
See application file for complete search history.

(56) References Cited

U.S. PATENT DOCUMENTS

| | | | | |
|---|---|---|---|---|
| 4,714,875 A | * | 12/1987 | Bailey et al. ............ | 324/73.1 |
| 4,829,200 A | * | 5/1989 | Downey .................. | 326/109 |
| 5,744,995 A | * | 4/1998 | Young .................... | 327/407 |
| 6,429,680 B1 | * | 8/2002 | Jeffery et al. ............ | 326/38 |

* cited by examiner

*Primary Examiner*—James H. Cho

(57) ABSTRACT

An improved input buffer providing configurable single-ended and differential signaling capability, comprising an input signal comparator, a first pad connected to one input of the comparator. An internal reference voltage source may be connected to one terminal of a first selection switch. The second terminal of the first selection switch is connected to the second input of the comparator and one terminal of a second selection switch is connected to the second input of the comparator. Further, a second input pad is connected to the second terminal of the second selection switch. The invention also includes a mode selector that enables the first selection switch and disables the second selection switch for providing single-ended operation using the internal reference voltage source, or enables the second selection switch and disables the first selection switch for enabling differential operation or single-ended operation using an external voltage reference.

21 Claims, 5 Drawing Sheets

| Mode | Operation |
|---|---|
| 0 | Single Ended |
| 1 | Differential |

| Mode | Operation |
|---|---|
| 0 | Single Ended |
| 1 | Differential |

INPUT BUFFER AND METHOD OF OPERATING THE SAME

TECHNICAL FIELD OF THE INVENTION

The present invention relates to input/output in integrated circuits generally, and, more particularly, the invention relates to configurable input buffers in integrated circuits.

BACKGROUND OF THE INVENTION

Integrated circuits require input/output buffers for driving signals to/from other parts of the integrated circuit. There are two basic modes of signaling namely, differential mode and single-ended mode. Single-ended signaling requires a reference voltage; variation around this reference voltage is registered as a high or low signal whereas in differential signaling the signal provides its own reference. Differential signaling provides advantages over single-ended signaling in terms of signal swing, noise immunity etc.; however, the choice of signaling mode depends upon the nature of the application.

To support both types of signaling modes present day integrated circuits provide separate Input/Output (I/O) blocks. However, this approach requires, for instance, additional pins thereby increasing the size and cost of the integrated circuit. It is therefore desirable to enable I/O blocks of integrated circuits to support both modes of signaling.

SUMMARY OF THE INVENTION

To address the above-discussed deficiencies of the prior art, it is a primary object of the present invention to overcome the shortcomings of the prior art and provide a mechanism that enables I/O blocks to be configurable for single-ended or differential signaling. Broadly introduced is an input buffer operable to provide both single-ended signaling and differential signaling. The input buffer comprises a mode selector that is operable to use (i) an internal reference voltage source in one mode to provide single-ended operation, and (ii) an external voltage reference in another mode to provide one of differential operation and single-ended operation.

To achieve this primary objective, an advantageous embodiment of the present invention provides an improved input buffer adapted to provide single-ended and differential signaling capability, comprising:
  an input signal comparator,
  a first pad connected to one input of said comparator,
  an internal reference voltage source connected to one terminal of a first selection switch,
  a second terminal of said first selection switch connected to a second input of said comparator,
  one terminal of a second selection switch connected to the second input of the comparator,
  a second input pad connected to the second terminal of the second selection switch,
  a mode selector that (i) enables the first selection switch and disables the second selection switch for providing single-ended operation using the internal reference voltage source, and (ii) enables the second selection switch and disables the first selection switch for enabling differential operation and single-ended operation using an external voltage reference.

The exemplary selection switches may suitably be analog transmission gates.

This improved input buffer may further comprise a third selection switch connected between the first input pad and the first input of the comparator to facilitate the implementation of multi-channel inputs.

Another advantageous embodiment of the present invention provides a method for providing configurable single-ended and differential receiving capability in input buffers, illustratively comprising the steps of:
  providing an input signal comparator,
  connecting one input pad to one input of said comparator,
  connecting an internal reference voltage source to one terminal of a first selection switch,
  connecting a second terminal of said first selection switch to a second input of said comparator,
  connecting one terminal of a second selection switch to the second input of said comparator,
  connecting a second input pad to the second terminal of the second selection switch, and
  providing a mode selector that (i) enables the first selection switch and disables the second selection switch for providing single-ended operation using the internal reference voltage source, and (ii) enables the second selection switch and disables the first selection switch for enabling differential operation and single-ended operation using an external voltage reference.

This exemplary method may further comprise the step of connecting a third selection switch between said first input pad and first input of said comparator to facilitate the implementation of multi-channel inputs.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; and the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The invention will now be described with reference to the accompanying drawings, in which like reference numerals represent like parts, and in which.

DETAILED DESCRIPTION

FIGS. 1 through 5, discussed below, and the various embodiments used to describe the principles of the present invention in this patent document are by way of illustration only and should not be construed in any way to limit the scope of the invention. Those skilled in the art will understand that the principles of the present invention may be associated with any suitably arranged input buffer for use with integrated circuits.

Figure 1:
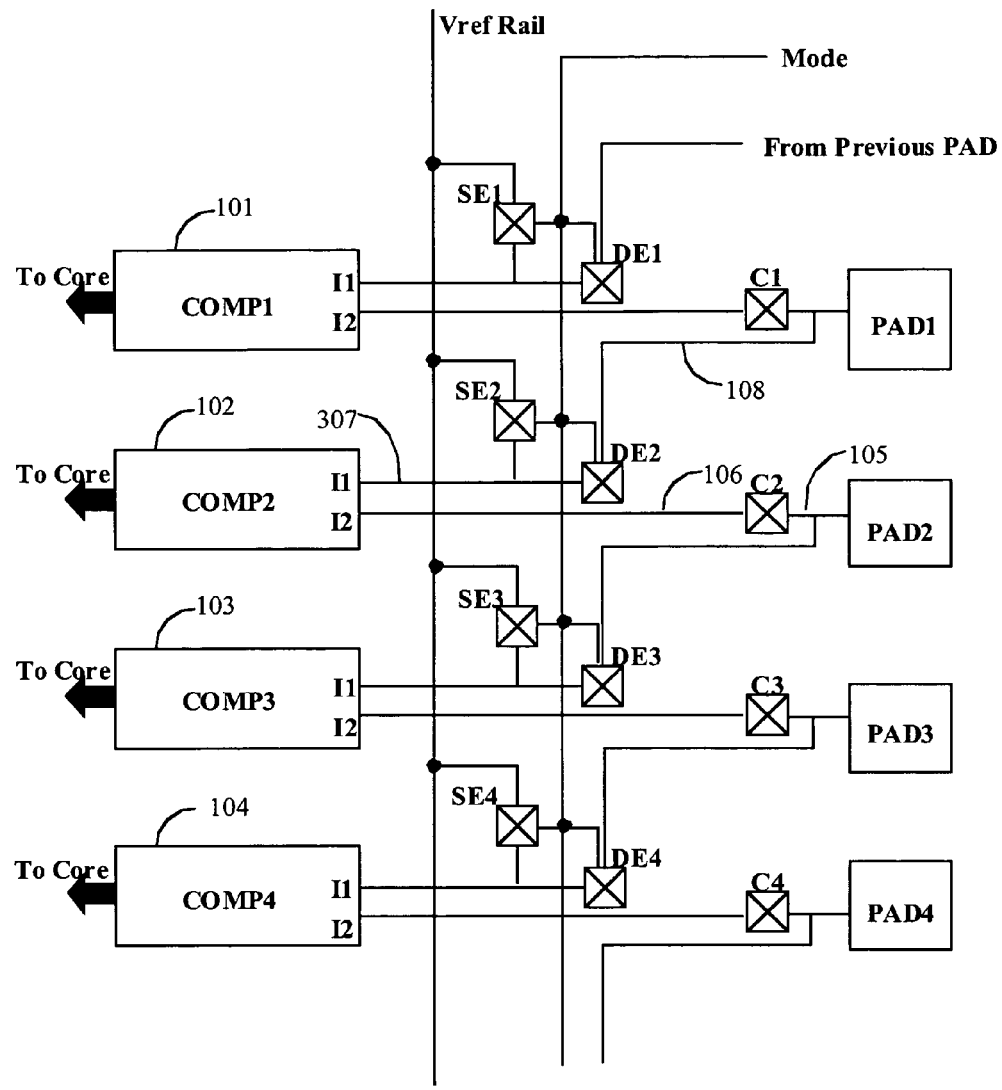
FIG. 1 illustrates a schematic block diagram of an exemplary embodiment of an input buffer in accordance with the principles of the present invention.

Turning initially to FIG. 1, illustrated is a schematic block diagram of an exemplary embodiment of an input buffer in accordance with the principles of the present invention. The input buffer has input pads PAD1, PAD2, PAD3 and PAD4, which connect to the first input of receiver comparators COMP1, COMP2, COMP3 and COMP4 through switches C1, C2, C3 and C4 respectively. The second input of each comparator is connected to a reference voltage rail Vref through a switch (SE1 or SE2 or SE3 or SE4) using a mode selection signal MODE. Switches DE1, DE2, DE3 and DE4 further connect the second input of the comparators to the previous PAD. The outputs of the comparators provide the drive signal to internal circuitry. The different modes of signaling can be realized by selectively enabling or disabling the switches.

Figure 2:
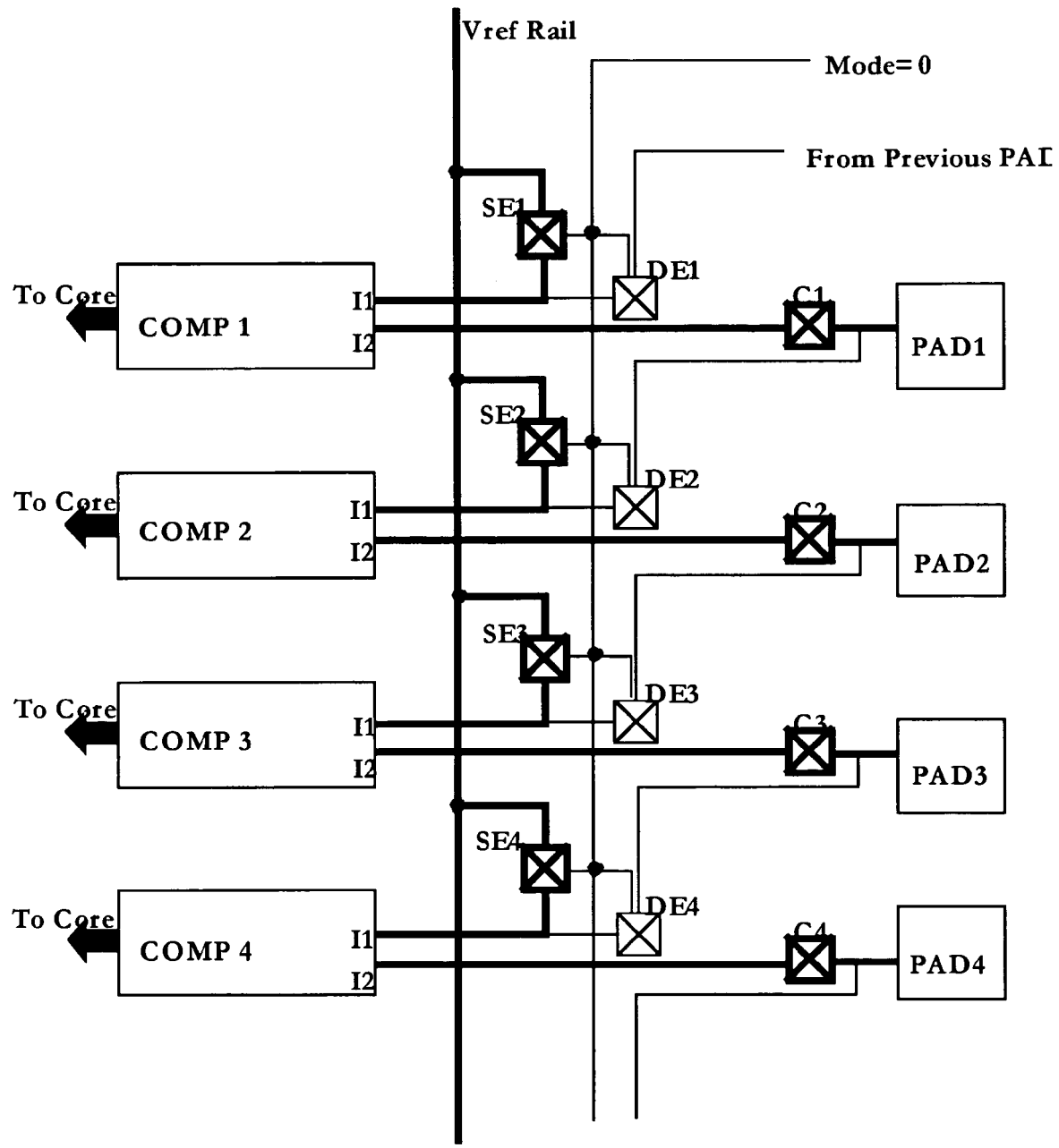
FIG. 2 illustrates a flow diagram of an exemplary method for single-ended signaling within the input buffer of FIG. 1 in accordance with the principles of the present invention.

Turning next to FIG. 2, illustrated is a flow diagram of an exemplary method for single-ended signaling within the input buffer of FIG. 1 in accordance with the principles of the present invention. The following description illustrates one possible manner of achieving the desired mode of signaling. The highlighted switches and lines in the corresponding drawings show conducting switches and lines. In discussing the exemplary embodiment hereof, concurrent reference is made to the input buffer of FIG. 1. The switches DE1, DE2, DE3 and DE4 are switched off to disconnect the second input of the comparator from the previous pad by appropriately setting the MODE line. Switches SE1, SE2, SE3 and SE4 and switches C1, C2, C3 and C4 are enabled to connect the second input to the Vref rail and the Pads to their respective comparators. This achieves single-ended driving by the signal received at Pads being compared to the internal reference voltage.

Figure 3:
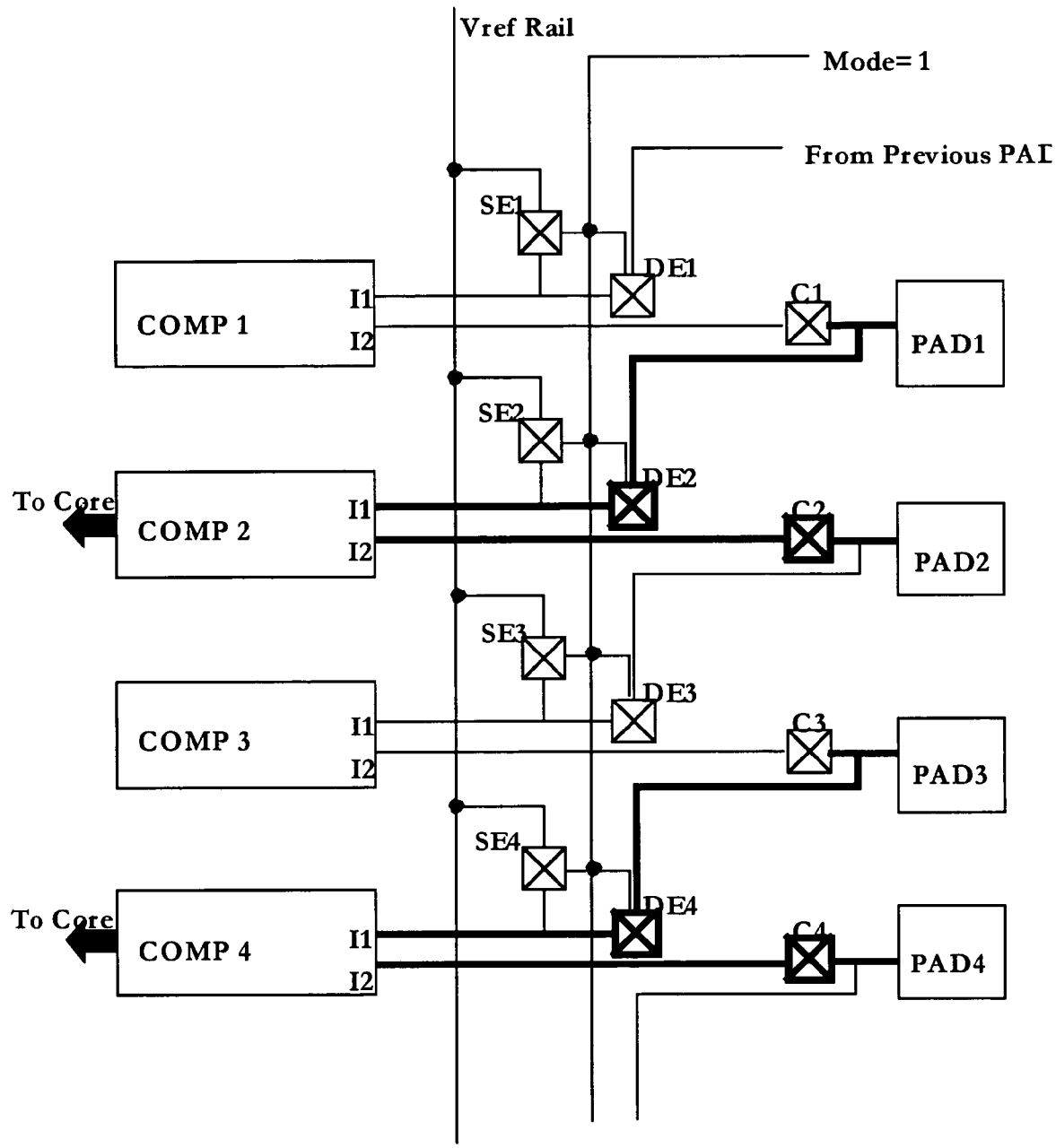
FIG. 3 illustrates a flow diagram of an exemplary method for differential signaling within the input buffer of FIG. 1 in accordance with the principles of the present invention.

Turning next to FIG. 3, illustrated is a flow diagram of an exemplary method for differential signaling within the input buffer of FIG. 1 in accordance with the principles of the present invention. In discussing the exemplary embodiment hereof, concurrent reference is made to the input buffer of FIG. 1. The switches C1, C2, C3 and C4 and switches DE1, DE2, DE3 and DE4 are alternately enabled to connect two pads to the inputs of one comparator thus providing a differential signal to the comparator. The switches SE1, SE2, SE3 and SE4 are disabled to disconnect the comparators from the Vref rail.

Figure 4:
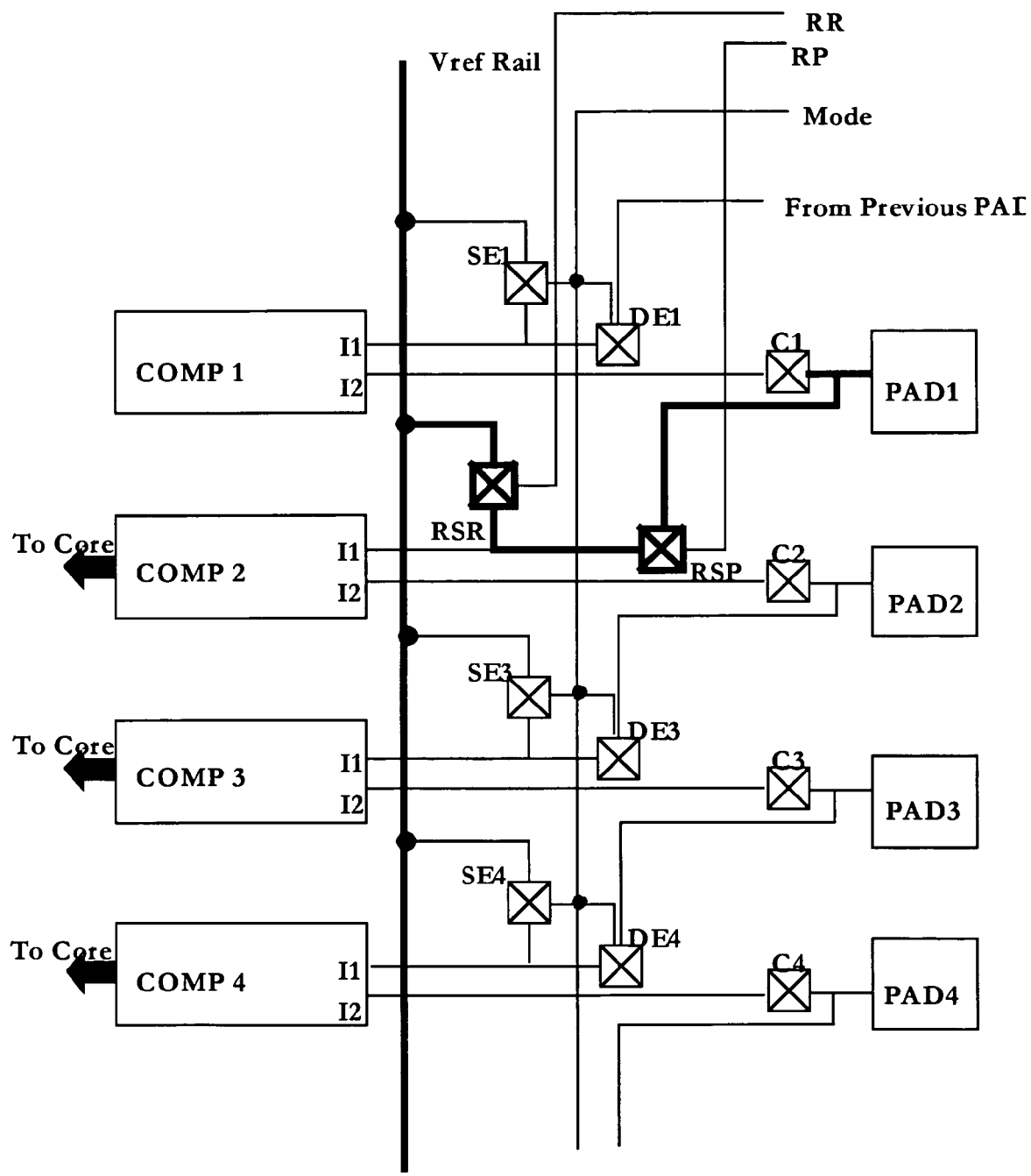
FIG. 4 illustrates a flow diagram for a reference voltage supply of a type suitable for the input buffer of FIG. 1 in accordance with the principles of the present invention.

FIG. 4 illustrates a flow diagram for a reference voltage supply of a type suitable for the input buffer of FIG. 1 in accordance with the principles of the present invention. In discussing the exemplary embodiment hereof, concurrent reference is made to the input buffer of FIG. 1. The invention further provides the flexibility to choose any desired Vref by dedicating one pad for applying reference voltage. In the present example, PAD1 is connected to the reference voltage rail through switches RSR and RPS. When PAD1 is not used as a reference voltage supply pin, it can be used as a normal input pad. For using PAD1 in single ended mode RSR is pulled high and RSP is pulled low. For using PAD1 in differential mode RSR is pulled low and RSP is pulled high. The truth table summarizes the above-mentioned options.

TABLE 1

| OPTIONS FOR PAD1 | | |
|---|---|---|
| RR | RP | MODE |
| 1 | 1 | Reference Pin |
| 1 | 0 | Single Ended |
| 0 | 1 | Differential |

Figure 5:
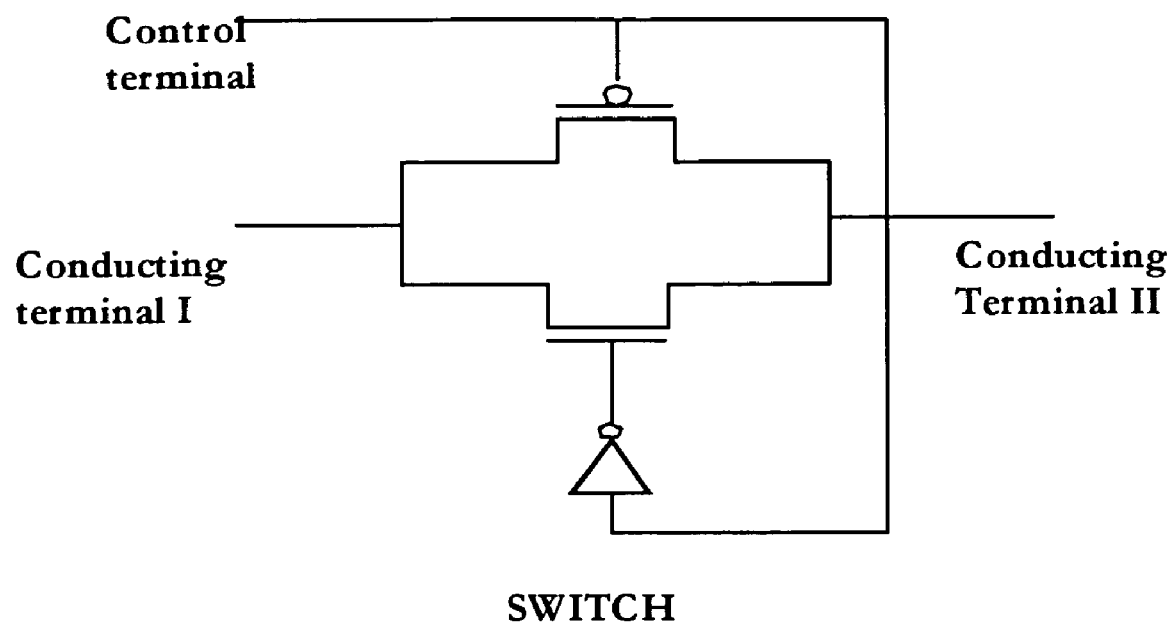
FIG. 5 illustrates an exemplary switch in accordance with the principles of the present invention.

FIG. 5 illustrates an exemplary switch in accordance with the principles of the present invention. A switch can be easily realized by a Complementary MOS transistor, providing its control terminal to enable or disable the connection of its conducting terminals. It is intended that the present invention encompass such changes and modifications as fall within the scope of the appended claims.

What is claimed is:

1. An improved input buffer providing configurable single-ended or differential signaling capability, comprising:
   an input signal comparator,
   a first input pad connected to a first input of said comparator,
   an internal reference voltage source connected to a first terminal of a first selection switch,
   a second terminal of said first selection switch connected to a second input of said comparator,
   a first terminal of a second selection switch connected to the second input of the comparator,
   a second input pad connected to a second terminal of the second selection switch, and
   a mode selector operable to enable the first selection switch and disable the second selection switch for providing single-ended operation using the internal reference voltage source, and to enable the second selection switch and disable the first selection switch for enabling differential operation or single-ended operation using an external voltage reference.

2. The improved input buffer as claimed in claim 1, wherein the selection switches are analog transmission gates.

3. The improved input buffer as claimed in claim 1, further comprising a third selection switch connected between said first input pad and the first input of said comparator to facilitate implementation of multi-channel inputs.

4. A method for providing configurable single-ended or differential receiving capability in input buffers, comprising the steps of:
   providing an input signal comparator,
   connecting a first input pad to a first input of said comparator,
   connecting an internal reference voltage source to a first terminal of a first selection switch,
   connecting a second terminal of said first selection switch to a second input of said comparator,
   connecting a first terminal of a second selection switch to the second input of said comparator,
   connecting a second input pad to a second terminal of the second selection switch, and
   providing a mode selector operable to enable the first selection switch and disable the second selection switch for providing single-ended operation using the internal reference voltage source, and to enable the second selection switch and disable the first selection switch for enabling differential operation or single-ended operation using an external voltage reference.

5. The method as claimed in claim 4, further comprising the step of connecting a third selection switch between said first input pad and the first input of said comparator to facilitate implementation of multi-channel inputs.

6. An input buffer operable to provide both single-ended signaling and differential signaling, comprising a mode selector that is operable to:
  (i) use an internal reference voltage source in a first mode to provide single-ended operation, and
  (ii) use an external voltage reference in a second mode to provide one of differential operation and single-ended operation;
  wherein the mode selector is operable to control first and second selection switches to control whether the input buffer operates in the first mode or the second mode, the first selection switch coupled to the internal reference voltage source, the second selection switch coupled to the external voltage reference.

7. The input buffer as set forth in claim 6 further comprising an input signal comparator.

8. The input buffer as set forth in claim 7 further comprising a first pad coupled to one input of said comparator.

9. The input buffer as set forth in claim 8 further comprising the internal reference voltage source connected to one terminal of the first selection switch.

10. The input buffer as set forth in claim 9 further comprising a second terminal of said first selection switch connected to a second input of said comparator.

11. The input buffer as set forth in claim 10 further comprising one terminal of the second selection switch connected to said second input of said comparator.

12. The input buffer as set forth in claim 11 further comprising a second input pad connected to a second terminal of said second selection switch.

13. The input buffer as set forth in claim 12 wherein said mode selector is operable to enable said first selection switch to use said internal reference voltage source in said first mode to provide said single-ended operation.

14. The input buffer as set forth in claim 13 wherein said mode selector is operable to disable said second selection switch.

15. The input buffer as set forth in claim 12 wherein said mode selector is operable to enable said second selection switch to use said external voltage reference in said second mode to provide one of said differential operation and said single-ended operation.

16. The input buffer as set forth in claim 15 wherein said mode selector is operable to disable said first selection switch.

17. The input buffer as set forth in claim 12, wherein said selection switches are analog transmission gates.

18. The input buffer as set forth in claim 12, further comprising a third selection switch associated with said comparator to facilitate multi-channel inputs.

19. The input buffer as set forth in claim 6, further comprising an input signal comparator having a first input coupled to a first input pad and a second input;
  wherein the first selection switch has a first terminal coupled to the internal reference voltage source and a second terminal coupled to the second input of the comparator; and
  wherein the second selection switch has a first terminal coupled to a second input pad and a second terminal coupled to the second input of the comparator.

20. The input buffer as set forth in claim 19, wherein the mode selector is operable to:
  enable the first selection switch and disable the second selection switch to provide the single-ended operation using the internal reference voltage source; and
  enable the second selection switch and disable the first selection switch to provide the differential operation or the single-ended operation using the external voltage reference.

21. A method, comprising:
  enabling a first selection switch and disabling a second selection switch to provide single-ended operation in an input buffer using an internal reference voltage; and
  enabling the second selection switch and disabling the first selection switch to provide differential operation or single-ended operation in the input buffer using an external voltage reference;
  wherein the first selection switch is coupled to the internal reference voltage and the second selection switch is coupled to the external voltage reference.

* * * * *